United States Patent [19]

Dillon

[11] Patent Number: 4,803,732
[45] Date of Patent: Feb. 7, 1989

[54] HEARING AID AMPLIFICATION METHOD AND APPARATUS

[76] Inventor: Harvey A. Dillon, 17 Chakola Ave., Hornsby Heights, New South Wales 2077, Australia

[21] Appl. No.: 758,557

[22] PCT Filed: Oct. 25, 1984

[86] PCT No.: PCT/AU84/00223
§ 371 Date: Jun. 17, 1985
§ 102(e) Date: Jun. 17, 1985

[87] PCT Pub. No.: WO85/02085
PCT Pub. Date: May 9, 1985

[30] Foreign Application Priority Data

Oct. 25, 1983 [AU] Australia ............... PG2040

[51] Int. Cl.$^4$ .............. H04R 25/00; H03G 5/00; H03G 7/00; H03G 9/20
[52] U.S. Cl. .................. 381/68.2; 381/29; 381/68.4; 381/106
[58] Field of Search .......... 179/107 FD, 107 R; 381/68, 29, 120, 121, 106, 68.1–68.4

[56] References Cited

U.S. PATENT DOCUMENTS

| | | | |
|---|---|---|---|
| 3,764,745 | 10/1973 | Bottcher et al. | 179/107 FD |
| 3,818,149 | 6/1974 | Stearns et al. | 381/68 |
| 3,848,091 | 11/1974 | Stearns et al. | 73/585 |
| 4,025,723 | 5/1977 | Blackledge | 179/107 R |
| 4,061,875 | 12/1977 | Freifeld et al. | 381/72 |
| 4,099,035 | 7/1978 | Yarick | 179/107 FD |
| 4,118,604 | 10/1978 | Yanick | 179/107 FD |
| 4,366,349 | 12/1982 | Adelman | 179/107 FD |
| 4,454,609 | 6/1984 | Kates | 381/68 |
| 4,517,415 | 5/1985 | Laurence | 381/68 |

FOREIGN PATENT DOCUMENTS

| | | | |
|---|---|---|---|
| 2808516 | 9/1979 | Fed. Rep. of Germany | 179/107 FD |
| 2828756 | 1/1980 | Fed. Rep. of Germany | 179/107 FD |
| 0159199 | 10/1982 | Japan | 179/107 FD |
| 1553277 | 9/1979 | United Kingdom | . |
| 2091065 | 7/1982 | United Kingdom | . |

OTHER PUBLICATIONS

Villchur E., "Signal Processing To Improve Speech Intelligibility in Perceptive Deafness", Journal of the Acoustical Society of America, vol. 53, No. 6, pp. 1642–1657.
WO 83/02212, "Method and Apparatus for Adapting the Transfer Function in a Hearing Aid", Peter Biegaard et al., Jun. 23, 1986.

Primary Examiner—Jin F. Ng
Assistant Examiner—Danita R. Byrd
Attorney, Agent, or Firm—Harness, Dickey & Pierce

[57] ABSTRACT

An amplification circuit for hearing aids performs independent amplification of different frequency bands of the signal generated by a microphone of the hearing aid, to match the loss of hearing of a user of the hearing aid. Prior to this multi-band amplification, however, the microphone output signal is passed through an optional filter having a characteristic which is the inverse of the spectrum of long term speech, and through a signal compressor. The signals from the multi-band amplification are combined using an adder and the combined signal is modified by a control signal derived from the envelope of the signal generated by the microphone. The result of this processing is to cause the range of spectral shapes present in received signals to be enlarged or exaggerated in the output signal, but to cause the range of overall levels present in the received signal to be decreased in the output signal. The processing thus increases both signal comfort and signal discriminability for the hearing impaired user of the hearing aid.

13 Claims, 3 Drawing Sheets

HEARING AID AMPLIFICATION METHOD AND APPARATUS

TECHNICAL FIELD

This invention concerns hearing aids. More particularly, it concerns a multi-band amplification system for use in hearing aids.

BACKGROUND ART

Conventional hearing aids amplify all received sounds to increase their loudness. In most instances, however, the hearing loss of a deaf or partially deaf person is different at different frequencies. Furthermore, the range of intensities which the partially deaf person can comfortably hear is often different at different frequencies. More recent hearing aids, therefore, have been constructed so that their amplification is frequency and level dependent. In this way the amplified signal can be matched to the impaired hearing of the user of the aid.

One example of such a "matched" hearing aid is one that was developed in 1973. This well-known hearing aid uses a multi-band compression system, and is set up so that the signal from each frequency channel (band) varies over a reduced range of levels. This hearing aid can be used to fit the residual hearing of its user fairly accurately, with the result that a user certainly hears the incident sound in each frequency band equally.

Such a hearing aid, however, does not permit the user of the aid to discriminate easily between different sounds. It has now been found that this inability to discriminate between sounds is due to the reduction in the range of spectral shapes that are associated with different speech sounds.

DISCLOSURE OF THE PRESENT INVENTION

It is an objective of the present invention to provide an amplification circuit for use in a hearing aid in which not only is the frequency-dependent amplification for a user having impaired hearing maintained, but the acoustic cues which are associated with particular speech sounds are exaggerated.

This objective is achieved by a novel form of multi-band non-linear processing, in which the signal generated by the microphone of the hearing aid is compressed, then the intensity range of signals in each of a plurality of separate frequency bands within the hearer's frequency range is expanded, each frequency band is amplified separately, the amplified signals are combined, and the combined signal is modified by a signal derived from the envelope of the originally received signal.

Preferably the signal received by the microphone of the hearing aid is first passed through a filter which has a response that is the inverse of the long term average spectrum of speech, to prevent the low frequency channels in the amplification stage from almost always having a higher gain than the high frequency channels.

The division of the received and compressed signal into different frequency channels is effected using band pass filters, and the amplification is a non-linear amplification, which is achieved by a combination of an expander and an attenuator.

The combining of the amplified signal is preferably effected using an adder and the modification of the output signal from the adder is conveniently effected using a multiplier which (a) reinserts variations of the received signal into the output signal and (b) acts as a limiter to prevent output signals from having an intensity which is sufficient to cause loudness discomfort in the user of the hearing aid.

Thus, according to the present invention, a method of amplifying a signal received by the microphone of a hearing aid comprises the steps of (a) compressing the output signal from the microphone;

(b) dividing the compressed signal into a plurality of separate frequency bands within the hearer's frequency range;

(c) expanding the signal within each separate frequency band;

(d) combining the expanded signals of each separate frequency band; and (e) modifying the combined signal by a signal which is derived from the envelope of the output signal from the microphone.

Also according to the present invention, an amplification circuit for performing multi-band amplification of the signal from a microphone of a hearing aid comprises:

(i) a plurality of band pass filters, each adapted to pass a respective frequency band within an audio frequency range;

(ii) an equal plurality of amplifiers, each amplifier being connected to the output of a respective band pass filter; and (iii) signal combining means for combining the output of said amplifiers; and is characterised in that (a) the amplification circuit includes a compressor, the input to which is the signal generated by said microphone, and the output of which is connected to said plurality of band pass filters;

(b) each of said plurailty of amplifiers operates as an expander; and (c) the amplification circuit also includes signal modifying means for introducing into the signal from said combining means at least some of the variations in the signal generated by said microphone.

The plurality of band pass filters and their associated amplifiers may be connected in parallel, or they may be connected in series. If they are connected in series, each band pass filter amplifies by a factor greater than unity the signal within the selected band but amplifies out-of-band signals by unity.

These and other features of the present invention will become more apparent from the following description of preferred embodiments of the present invention. In this description, reference will be made to the accompanying drawings.

DETAILED DESCRIPTION OF ILLUSTRATED EMBODIMENTS

Figure 1:
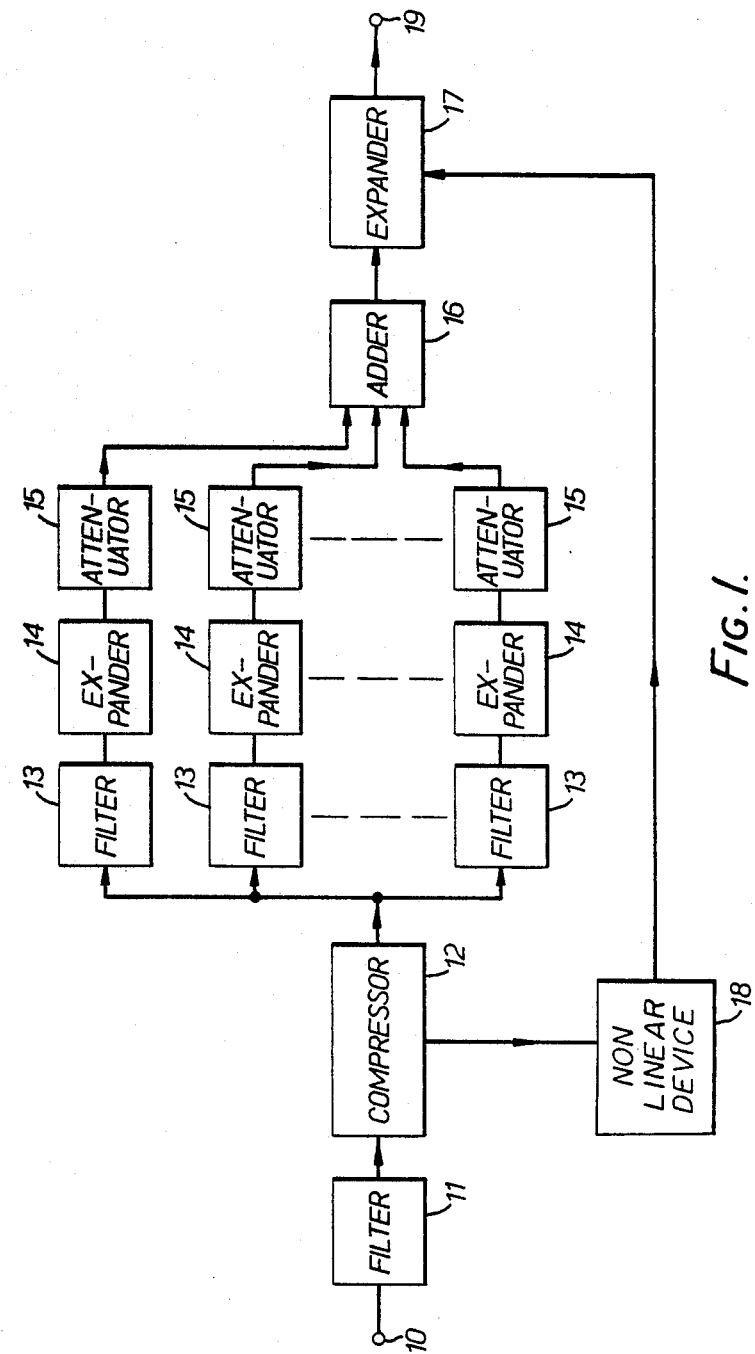
FIG. 1 is a block diagram of one form of amplification circuit, constructed in accordance with the present invention, with the plurality of band pass filters connected in parallel.

In the circuit shown in FIG. 1, an electrical signal generated by the microphone of a hearing aid upon receipt of an audio signal is input at 10 to an input filter 11. As indicated above, the response of the filter 11 preferably has a frequency-dependency which is the inverse of the long term average spectrum of speech. The output from filter 11 is input to a fast-acting compressor 12 which removes the intensity fluctuations in the signal. A compressor (sometimes called a compression amplifier) reduces the range of the input signal. The use of compressor 12 reduces the dynamic range of the signal to be handled in the various frequency channels of the amplification circuit.

The compressor of a prototype unit constructed by the present inventor consists of a divider and a detector which generated a quasi d.c. voltage. (The quasi d.c. voltage is also used as a control voltage for the modification of the output signal from the signal combining means, which will be described in more detail later.) If the input signal level from filter 11 falls to a value which is 20 dB or more below the long term average signal level, the compressor ceases to operate as a compressor, but is arranged to amplify linearly so that low level noise is not excessively amplified. The control voltage, therefore, is clamped to always lie above the compression threshold voltage.

The signal from compressor 12 is supplied to the inputs of a plurality of band-pass filters 13. The band-pass filters divide the output signal from compressor 12 into a plurality of separate frequency bands which, together, span the entire frequency range of the hearing aid. In the prototype unit, six frequency bands or channels are used.

Each signal from a filter 13 is input into a respective fast-acting expander 14. An expander expands the range of its input signal; that is, for every decibel increment of signal input to an expander, the expander produces an output which increases by more than one decibel.

The gain of each expander 14 is chosen so that channels containing the dominant spectral region of each sound receive more gain than channels where little power is present. In the prototype unit, each expander comprises a detector (which generates a control voltage) and a multiplier. It is designed to provide a fast acting 2:1 compression ratio, with an upper limit above which the expander operates as a linear amplifier. This last feature prevents overshoots from the whole-band compressor 12 from being expanded. If a speech sound with a spectral shape equal to the long term average spectral shape is received by the microphone of the hearing aid, all expanders would produce the same output.

The output of each expander 14 is input into an associated attenuator 15, which modifies the gain in its respective frequency band. The gain values of the attenuators 15 are selected to appropriately match the frequency response of the hearing aid to the hearing loss of the user of the aid. Thus the gain of each attenuator 15 is selected so that the average speech sound is amplified to lie along the "most comfortable loudness level" contour of the user of the hearing aid. The gain values must be selected individually for each subject. In practice, there is a complication in having each channel amplified separately. This complication is caused by loudness summation by the user of the hearing aid, which will make the combined sound louder than the "most comfortable loudness lever" (usually by 5 to 10 dB). This problem can be readily overcome by including a volume control in the output of the hearing aid.

The outputs of all the attenuators 15 are combined by signal adder 16, to re-establish a signal spanning the entire frequency range of the aid. This re-established signal is input into an output expander 17, which performs two functions. Firstly, it reinserts some or all of the variations in the overall level that were present in the input signal at 10, using the control voltage generated by compressor 12. It does this by taking the envelope of the signal input to compressor 12, optionally passing this envelope through a non-linear amplifier or other device 18, and feeding it also into the output expander 17. The degree of fluctuations inserted into the final output signal at terminal 19 (which is connected to the earphone of the hearing aid) is controlled by the instantaneous non-linearity of device 18. For example, if the input envelope is inserted without modification, there would be no compression of the output signal in the expander 17, whereas if the square root of the input signal is applied to expander 17 (which is the case in the prototype unit), there is a 2:1 compression limiting of the output signal from adder 16.

The control signal input to the expander 17 preferably has an upper limit to its intensity, which is calculated to prevent the output at 19 from exceeding a value that would cause loudness discomfort to a user of the hearing aid. In the prototype unit, the modification shown in FIG. 2 has been adopted for this purpose. The signals at the output of expander 17 are weighted using a filter 100 which has a characteristic which is the inverse of the loudness discomfort level contour of the user of the hearing aid. The output of the signal from filter 100 is supplied to detector 110, the output signal of which is input to comparator 111 where it is compared with a reference signal S. The output of comparator 111 is supplied to a mixer 112, where the weighting is applied to the input envelope signal of expander 17. Although this simple weighting circuit does not summate loudness contributions across frequencies in precisely the same way as the user of the hearing aid, it does perform correctly in a qualitative sense, and is quantitatively correct when the output spectral power is heavily concentrated in one narrow frequency range.

Figure 2:
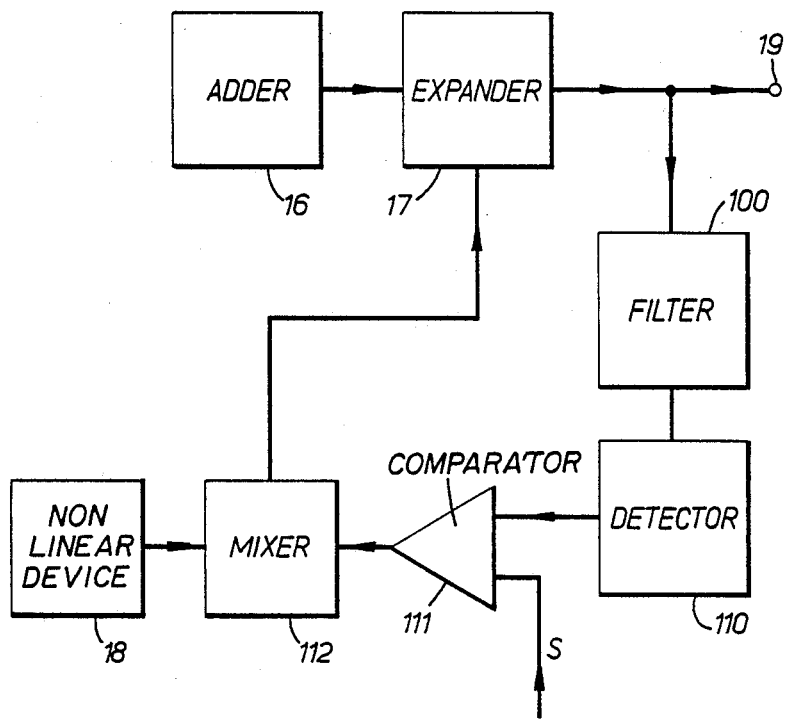
FIG. 2 illustrates a signal weighting circuit that may be used to modify the output signal of the hearing aid amplification circuit of FIG. 1.

It should be apparent to persons of skill in this art that the amplification system illustrated in FIG. 1, optionally modified by the circuit of FIG. 2, is effective to expand the shape of the spectrum of the signal present at any time, while compressing the overall intensity range of the signal.

Those skilled in this art will also recognise that variations in and modifications of the system illustrated in FIG. 1 are possible, without departing from the present inventive concept. One such variation is shown in FIG. 3.

Figure 3:
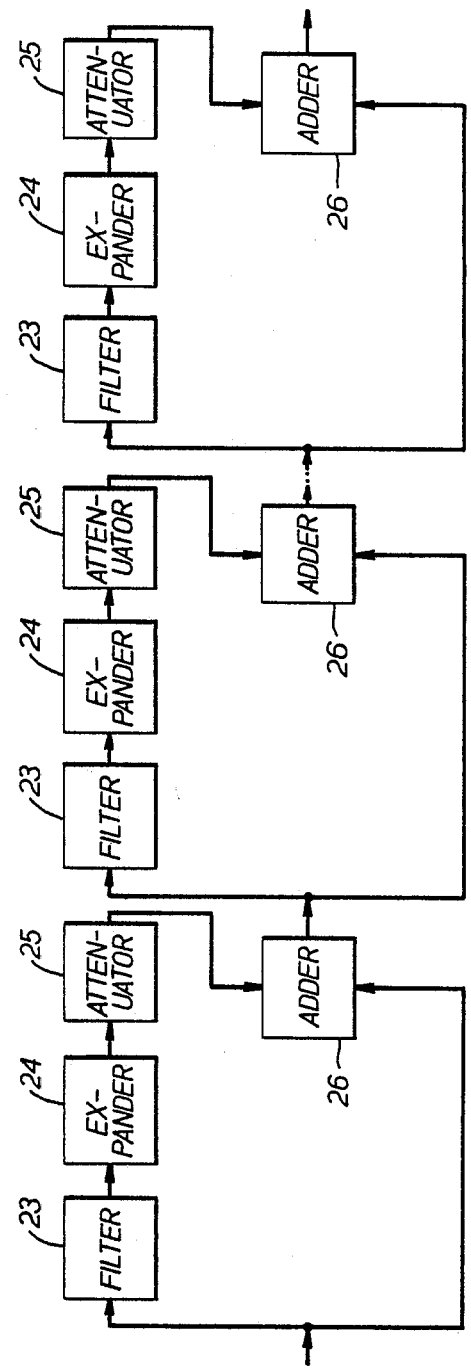
FIG. 3 illustrates how a plurality of band pass filters and non-linear amplifiers may be connected in series.

The arrangement illustrated in FIG. 3 is a serial arrangement of the band pass filters 13, expanders 14 and attenuators 15 of FIG. 1. As indicated earlier in this specification, when the multiple frequency channels are arranged in series, the filtering of the input signal must be such that the filter amplifies the signal in the selected frequency band, and passes all other frequencies with unity gain. This is effected in the arrangement of FIG. 3 by having the input signal to each channel fed both to a band pass filter 23 (which is followed by an expander 24 and attenuator 25 in the manner of the processing arrangement of FIG. 1) and to an adder 26 which also receives the signal that has been processed in the frequency channel.

An advantage of the series connection of frequency channels as illustrated in FIG. 3 is that the band interaction effects that can occur in the parallel arrangement used in the embodiment of FIG. 1 are avoided.

I claim:

1. A method of amplifying a signal received by a microphone of a hearing aid, said method comprising the steps of:
    (a) compressing the output signal from the microphone;
    (b) dividing the compressed signal into a plurality of separate frequency bands within a hearer's frequency range;
    (c) expanding the signal within each separate frequency band;
    (d) combining the expanded signals of each separate frequency band; and
    (e) modifying the combined signal by a signal which is derived from the envelope of the output signal from the microphone.

2. A method as defined in claim 1, in which the output signal from the microphone is passed through an input filter before being compressed, said input filter having a frequency-dependency which is the inverse of the long term average spectrum of speech.

3. A method as defined in claim 1, including weighting the modified combined signal by a signal derived from an output filter which has a characteristic which is the inverse of the loudness discomfort level curve of the hearer.

4. A method as defined in claim 2, including the step of weighting the modified combined signal by a signal derived from an output filter which has a characteristic which is the inverse of the loudness discomfort level curve of a user of the hearing aid, said weighting being effective to prevent loudness discomfort of the user of the hearing aid.

5. An amplification circuit for performing multi-band amplification of a signal from a microphone of a hearing aid comprising:
    (i) a plurality of band pass filters, each adapted to pass a frequency band within an audio frequency range;
    (ii) an equal plurality of amplifiers, each amplifier being connected to the output of a respective band pass filter; and
    (iii) signal combining means for combining the output of said amplifiers;

characterized in that
    (a) the amplification circuit includes a compressor, an input to said compressor being the signal from said microphone, and the output of said compressor being connected to said plurality of band pass filters;
    (b) each of said plurality of amplifiers operates as an expander; and
    (c) the amplification circuit also includes signal modifying means for modifying an output signal from said combining means with a signal which is derived from the envelope of an output signal of said microphone.

6. An amplification circuit as defined in claim 5, in which said compressor includes means to generate a control signal which varies with frequency in accordance with the envelope of the signal from said microphone.

7. An amplification circuit as defined in claim 6, including an input filter between the output of said microphone and the input to said compressor, said input filter having a frequency-dependency which is the inverse of the long term average spectrum of speech.

8. An amplification circuit as defined in claim 6, in which the signal combining means comprises an adder.

9. An amplification circuit as defined in claim 6, in which said signal modifying means comprises an expander receiving the output signal from said signal combining means and said control signal.

10. An amplification circuit as defined in claim 9, including means to modify said control signal before it is supplied to the multiplier of said signal modifying means.

11. An amplification circuit as defined in claim 10, including a signal weighting circuit, said signal weighting circuit comprising an output signal filter which has a characteristic which is the inverse of the loudness discomfort level curve of a user of the hearing aid, a comparator for comparing the output of said output signal filter with a reference signal, and a mixer for mixing the output signal of said comparator with the input control signal to the multiplier of said signal modifying means.

12. An amplification circuit as defined in claim 5, in which said plurality of band pass filters with their associated plurality of amplifiers are connected in parallel.

13. An amplification circuit as defined in claim 5, in which said plurality of band pass filters and their associated plurality of amplifiers are connected in series.

* * * * *